(12) United States Patent
Son et al.

(10) Patent No.: US 9,436,091 B2
(45) Date of Patent: Sep. 6, 2016

(54) PATTERNING METHOD USING SURFACE PLASMON

(71) Applicant: Samsung Display Co., Ltd., Yongin, Gyeonggi-Do (KR)

(72) Inventors: Yong Son, Suwon-si (KR); Min Kang, Seoul (KR); Bong-Yeon Kim, Seoul (KR); Dong-Eon Lee, Seoul (KR); Hyun-joo Lee, Seoul (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/444,255

(22) Filed: Jul. 28, 2014

(65) Prior Publication Data

US 2015/0234286 A1  Aug. 20, 2015

(30) Foreign Application Priority Data

Feb. 19, 2014 (KR) .......................... 10-2014-0018948

(51) Int. Cl.
*G03F 7/20* (2006.01)

(52) U.S. Cl.
CPC ......... *G03F 7/2016* (2013.01); *G03F 7/70375* (2013.01)

(58) Field of Classification Search
CPC .................................... G03F 7/26; G03F 7/20
See application file for complete search history.

(56) References Cited

U.S. PATENT DOCUMENTS

| 2005/0170657 | A1* | 8/2005 | Khang | ................ | B81C 1/00031 |
| | | | | | 438/706 |
| 2009/0087793 | A1 | 4/2009 | Kim et al. | | |
| 2011/0207054 | A1* | 8/2011 | Fattal | ..................... | G03F 7/201 |
| | | | | | 430/312 |
| 2011/0305994 | A1 | 12/2011 | Montelius | | |
| 2013/0017499 | A1* | 1/2013 | Ueno | .................. | H01L 21/0274 |
| | | | | | 430/322 |
| 2013/0200780 | A1 | 8/2013 | Lee | | |

FOREIGN PATENT DOCUMENTS

| JP | 2005-303197 A | 10/2005 |
| JP | 2010-50431 A | 3/2010 |
| JP | 2013-80866 A | 5/2013 |

OTHER PUBLICATIONS

Ho, Bun Chan et al. "Transmission Enhancement in an Array of Subwavelength Slits in Aluminum Due to Surface Plasmon Resonances", Bell Labs Technical Journal. 2005, 143-150, 10 (3), Wiley Periodicals, Inc, online.

J. A. Porto et al. "Transmission resonances on metallic gratings with very narrow slits", Physics Review Letters, Oct. 1999, 2845-2848, vol. 84, Issue14.

\* cited by examiner

*Primary Examiner* — Kathleen Duda
(74) *Attorney, Agent, or Firm* — Robert E. Bushnell, Esq.

(57) ABSTRACT

A method for forming a fine pattern includes forming an etching target material layer on a substrate, forming a first photoresist layer on the etching target material layer, forming a metal pattern on the first photoresist layer, the metal pattern having a plurality of lines and thin film lines alternately arranged, the lines having predetermined linewidth and thickness and are spaced apart from each other by a predetermined distance, exciting surface plasmons in the metal pattern by light irradiation to produce a surface plasmon resonance that exposes a fine first pattern shape in the first photoresist layer, forming a first photoresist pattern by removing the metal pattern and developing the first photoresist layer, and etching the etching target material layer by using the first photoresist pattern as a mask.

20 Claims, 10 Drawing Sheets

FIG. 7

PATTERNING METHOD USING SURFACE PLASMON

CLAIM OF PRIORITY

This application claims priority to and the benefit of Korean Patent Application No. 10-2014-0018948, filed on Feb. 19, 2014, with the Korean Intellectual Property Office, the disclosure of which is incorporated herein in its entirety by reference.

BACKGROUND OF THE INVENTION

1. Field of the Invention

Embodiments of the present invention relate to a technique for forming a nanopattern using a surface plasmon etching process and a display device including the pattern.

2. Description of the Related Art

Recently, there has been a growing interest in a nano-patterning technique capable of realizing a pattern with a fine linewidth. For example, it is required to arrange more elements or lines per unit area in order to achieve a high degree of integration of a semiconductor device or a display device, and in a case where a polarizer for a display device is intended to be manufactured in an in cell method, it is required to form a fine pattern having a linewidth of 100 nm or less. In order to meet the above requirements, a technique of forming a high-density fine pattern is needed to be developed.

Earlier patterns in a semiconductor or display device have in most cases been produced by photolithography. However, there is a limit in forming a fine pattern with a linewidth given in units of nanometer (nm) by a general photolithographic process. Therefore, research is currently being carried out to form a line pattern by using electron-beam lithography (e-beam lithography), nanoimprint, block copolymer, surface plasmon, or the like.

The above information disclosed in this Background section is only for enhancement of understanding of the background of the invention and therefore it may contain information that does not constitute prior art as per 35 U.S.C. 102.

SUMMARY OF THE INVENTION

Aspects of embodiments of the present invention are directed to a technique of forming a nanopattern uniformly by means of surface plasmons, and a display device including the nanopattern. Further, aspects of embodiments of the present invention are directed to a technique of forming an element pattern on a substrate, and a display device including the element pattern.

According to one aspect of the present invention, there is provided a method of foming a pattern, including forming an etching target material layer on a substrate, forming a first photoresist layer on the etching target material layer, forming a metal pattern on the first photoresist layer, the metal pattern in which a plurality of lines having predetermined linewidth and thickness are spaced apart from each other at a predetermined distance, exciting surface plasmons in the metal pattern by light irradiation to expose the first photoresist layer to form a first pattern shape, forming a first photoresist pattern by removing the metal pattern and developing the first photoresist layer, and etching the etching target material layer by using the first photoresist pattern as a mask.

The metal pattern may include a thin film portion between the lines adjacent to each other.

The thin film portion has a thickness of about 20 nm to about 50 nm.

The space between the adjacent lines is about 100 nm to about 300 nm.

The light irradiation comprises irradiating light with larger wavelength than the space between the adjacent lines.

The light irradiation comprises irradiating i-ray.

The first photoresist pattern has higher pattern density than the metal pattern.

The forming of the metal pattern may include forming a metal layer on the first photoresist layer, forming a second photoresist layer on the metal layer, patterning the second photoresist layer into a second pattern, etching the metal layer by using the patterned second photoresist layer as a mask and removing the second photoresist layer, and forming a deposition layer on the etched metal layer and the exposed first photoresist layer by performing metal deposition.

The forming of the metal pattern may include forming a metal layer on the first photoresist layer, and stamping the metal layer with a die engraved to have a pattern shape.

The metal layer is formed of any one selected from a group consisting of gold (Au), aluminum (Al), silver (Ag), chromium (Cr), nickel (Ni), titanium (Ti), tantalum (Ta), and tungsten (W).

The etching target material layer comprises at least one of a metal and a transparent conductive oxide (TCO).

According to another aspect of the present invention, there is provided a method of foming a pattern, including forming a first photoresist layer on a substrate, forming a metal pattern on the first photoresist layer, the metal pattern in which a plurality of lines having predetermined linewidth and thickness are spaced apart from each other at a predetermined distance, exciting surface plasmons in the metal pattern by light irradiation to expose the first photoresist layer to have a first pattern shape, forming a first photoresist pattern by removing the metal pattern and developing the first photoresist layer, depositing a pattern-forming material on the first photoresist pattern and the substrate, and removing the first photoresist pattern.

The metal pattern may include a thin film portion between the lines adjacent to each other.

The thin film portion has a thickness of about 20 nm to about 50 nm.

The space between the adjacent lines is about 100 nm to about 300 nm.

The light irradiation may include irradiating light with larger wavelength than the space between the adjacent lines.

The forming of the metal pattern may include forming a metal layer on the first photoresist layer, forming a second photoresist layer on the metal layer, patterning the second photoresist layer into a second pattern, etching the metal layer by using the patterned second photoresist layer as a mask and removing the second photoresist layer, and forming a deposition layer on the etched metal layer and the exposed first photoresist layer by performing metal deposition.

The forming of the metal pattern may include forming a metal layer on the first photoresist layer, and pressing the metal layer by using a master engraved with a pattern shape.

The pattern-forming material may include at least one of a metal and a transparent conductive oxide (TCO).

The pattern forming material has a linewidth in the range of 30 to 100 nm and is less than each of the predetermined linewidth and the predetermined distance of the metal pattern and the wavelength of light used to irradiate the metal pattern.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, certain elements or shapes may be simplified or exaggerated to better illustrate the present invention, and other elements present in an actual product may also be omitted. Thus, the drawings are intended to facilitate the understanding of the present invention. Like reference numerals refer to like elements throughout the specification.

In addition, when a layer or element is referred to as being "on" another layer or element, the layer or element may be directly on the other layer or element, or one or more intervening layers or elements may be interposed therebetween.

Figure 1A:
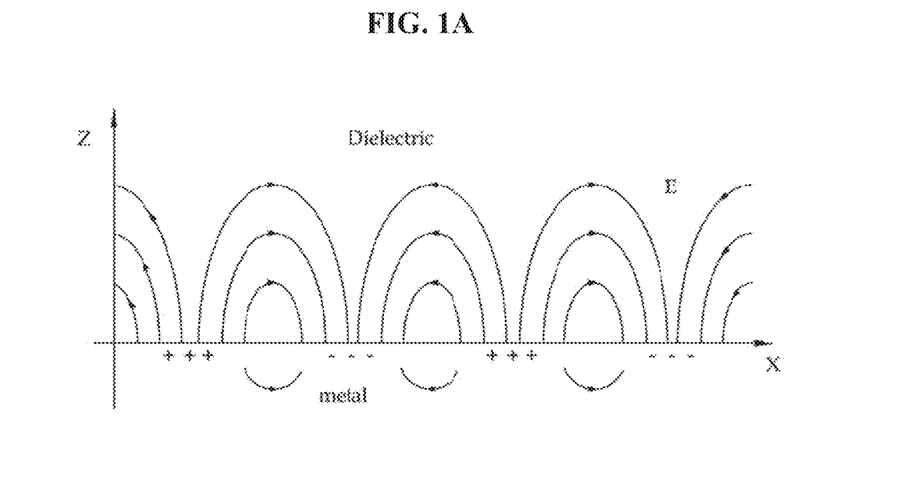
FIGS. 1A and 1B are mimetic diagrams illustrating surface plasmons between a metal and a dielectric.
Figure 1B:
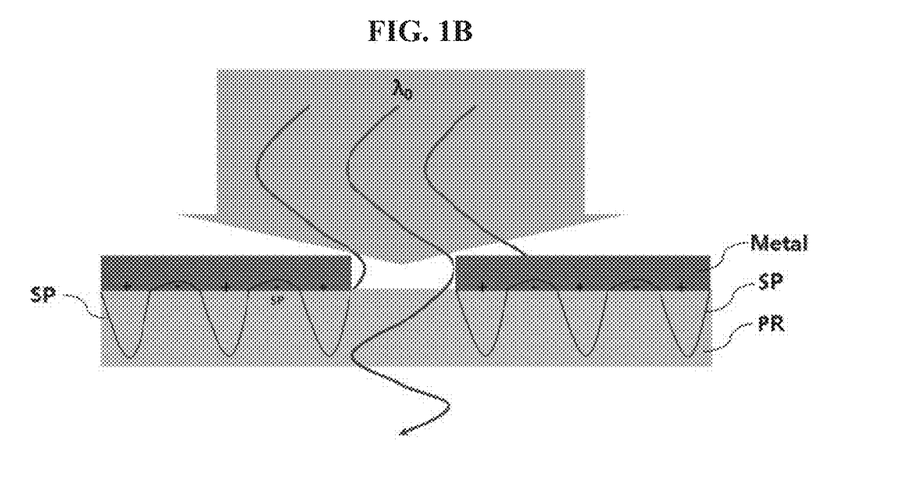

Turning now to FIGS. 1A and 1B, FIGS. 1A and 1B are mimetic diagrams illustrating surface plasmons at a boundary between metal and a dielectric. Referring to FIG. 1A, a metal layer is disposed under the X axis and a dielectric layer is disposed above the X axis, and an electric field E is generated in the dielectric layer by resonating surface plasmons.

Surface plasmons are collective charge (e.g., electron) density oscillations occurring at a metal surface. For instance, when external electromagnetic waves are incident on a surface of a metal grating while the metal and a dielectric material are in contact with each other, electrons excited in the metal surface oscillate, and collective electron density oscillations occur by resonance, such that surface plasmons are formed. This phenomenon is often called surface plasmon resonance (SPR).

In detail, many free electrons exist in a metal that is a conductor. The free electrons are not in a state of being bound to metal atoms, and thus it is easy for the free electrons to react to external specific stimulation. In the case where the metal has a predetermined pattern in particular, characteristics of the surface plasmons are exhibited by the behavior of the free electrons, and the surface plasmons have unique optical properties.

For example, as shown in FIG. 1B, in the case where an electromagnetic wave having a predetermined wavelength $\lambda_0$ is incident between metal layers while the metal layers are disposed spaced apart from each other at a predetermined distance on a photoresist PR layer that is a dielectric material, a surface plasmon SP wave is formed and propagates along an interface between the metal layer and the photoresist layer.

The surface plasmon SP also occurs by light irradiation, and wavelengths of light forming the surface plasmon resonance vary depending on the kinds, shapes, sizes, and arrangement forms of metals.

As described above, the light resonates, and thus the surface plasmon is generated, so that light absorption or scattering is amplified at the metal surface, and charges and light energy are transferred to the dielectric material by the amplification.

According to an embodiment of the present invention, a fine pattern can be produced using the surface plasmon resonance. Such a fine pattern is formed on a substrate to be an element pattern. The element pattern may be, for example, semiconductor device lines, thin film transistor electrodes, display device line, or wire grid polarizer patterns.

Hereinafter, according to a first embodiment of the present invention, a pattern forming method will be described in detail with reference to FIGS. 2A to 2J.

Figure 2A:
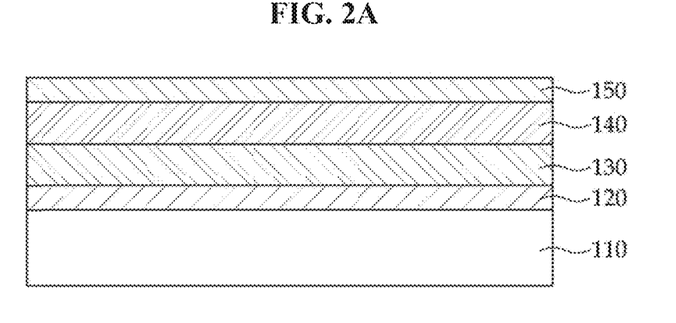
FIGS. 2A to 2J are cross-sectional views showing a process of forming a pattern according to a first embodiment of the present invention.

Referring now to FIG. 2A, an etching target material layer 120, a first photoresist layer 130, a metal layer 140, and a second photoresist layer 150 are sequentially formed on a substrate 110.

An antireflective layer (not shown), such as bottom antireflective coating (BARC), may be further formed between the etching target material layer 120 and the first photoresist layer 130 to prevent light irradiated at the time of exposure from being reflected from the substrate 110, thereby preventing re-exposure of the first photoresist layer 130 by the light.

The substrate 110 may be made out of an insulating material selected from a group consisting of glass, quartz, ceramic, plastic, or the like, but embodiments of the present invention are not limited thereto. The substrate 110 may also be made out of a metal material such as stainless steel.

The etching target material layer 120 includes at least one of a metal and a transparent conductive oxide (TCO). Examples of the metal may include at least one selected from a group consisting of copper (Cu), magnesium (Mg), silver (Ag), gold (Au), calcium (Ca), lithium (Li), chromium (Cr), and aluminum (Al). Examples of the transparent conductive oxide (TCO) may include at least one selected from a group consisting of indium tin oxide (ITO), indium zinc oxide (IZO), zinc oxide (ZnO), and indium oxide ($In_2O_3$).

The etching target material layer 120 may be a single layer or a multilayer structure. For instance, the etching target material layer 120 may have a structure in which a metal and a transparent conductive oxide (TCO) are alternately laminated.

The first photoresist layer 130 is patterned by the metal layer 140, and is then used as a mask to etch the etching target material layer 120. The first photoresist layer 130 may be made out of, for example, a negative photoresist or a positive photoresist.

In the step that will be described below, a surface plasmon resonance pattern is formed at the boundary between metal layer 140 and first photoresist layer 130. This surface plasmon resonance exposes portions of the first photoresist pattern to produce a fine first pattern in first photoresist layer 130 having a linewitdth much smaller than the second pattern previously formed in the metal layer 140, and having a much higher pattern density than the second pattern previously formed in the metal layer 140.

The metal layer 140 may be formed of any one metal of gold (Au), aluminum (Al), silver (Ag), chromium (Cr), nickel (Ni), titanium (Ti), tantalum (Ta), and tungsten (W), for example. The metal layer 140 may be produced by sputtering, plasma-enhanced chemical vapor deposition (PECVD), low-pressure chemical vapor deposition (LP-CVD), atomic layer deposition (ALD), or the like.

The second photoresist layer 150 is patterned to have a predetermined pattern, and is then used as a mask to etch the metal layer 140. For instance, a photocurable negative photoresist or positive photoresist may be used for the second photoresist layer 150. Besides, a resin-based photoresist formed of ultraviolet (UV) curing polymers or thermal curing polymers may also be used for the second photoresist layer 150. The second photoresist layer 150 may be formed by dispensing, spin coating, spray coating, dip coating, ink jet coating, vacuum deposition, or the like.

Figure 2B:
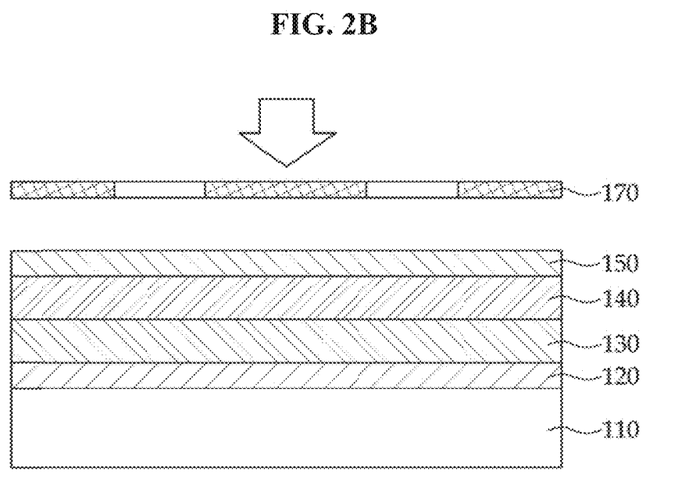

Referring to FIG. 2B, a mask 170 including exposure patterns is formed on the second photoresist layer 150, and light exposure is performed to expose the second photoresist layer 150. The mask 170 includes the exposure patterns to pattern the second photoresist layer 150.

Figure 2C:
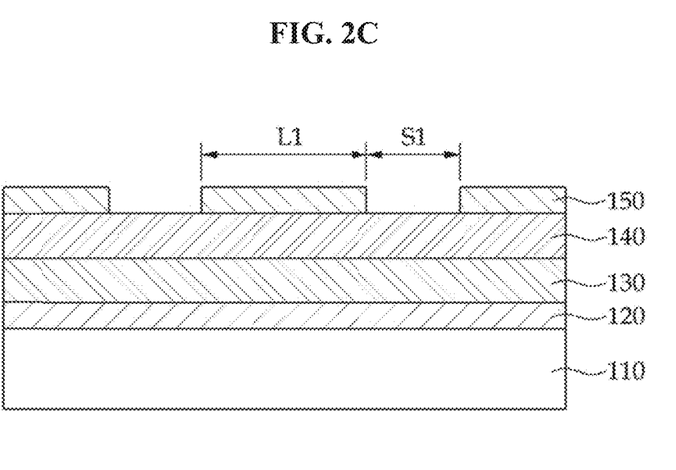

Referring to FIG. 2C, the exposed second photoresist layer 150 is developed such that the second photoresist layer 150 has second patterns. The second patterns have a predetermined linewidth L1, and are spaced apart from each other by a predetermined space S1.

Herein, photolithography is used to form the second pattern of the second photoresist layer 150. However, as will be discussed in the third embodiment of FIGS. 4A and 4B, the second photoresist layer 150 may be patterned by stamping technique using a die having a predetermined pattern after the second photoresist layer 150 is formed.

Figure 2D:
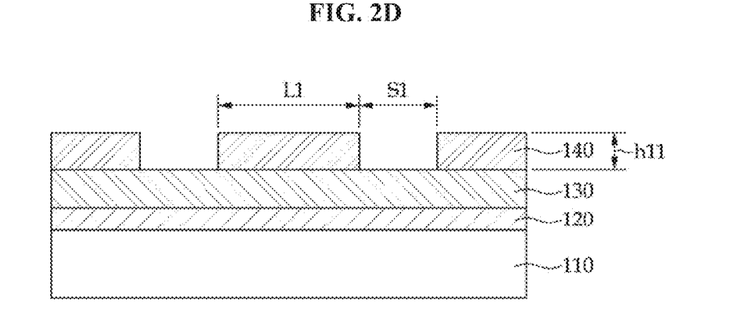

Returning to the first embodiment and FIG. 2D, the metal layer 140 is etched using the patterned second photoresist layer 150 as a mask, and then the second photoresist layer 150 is then removed, so that the metal layer 140 has the second pattern as shown in FIG. 2D. The metal layer 140 may be etched by wet etching, ion beam milling, or plasma reactive ion etching (RIE).

The second pattern has a lower pattern density as compared to a first photoresist pattern 131. For instance, the linewidth L1 of the second pattern may be larger than a linewidth d1 (see FIG. 2H) of the first photoresist pattern 131, and the space between the lines may also be larger.

Figure 2E:
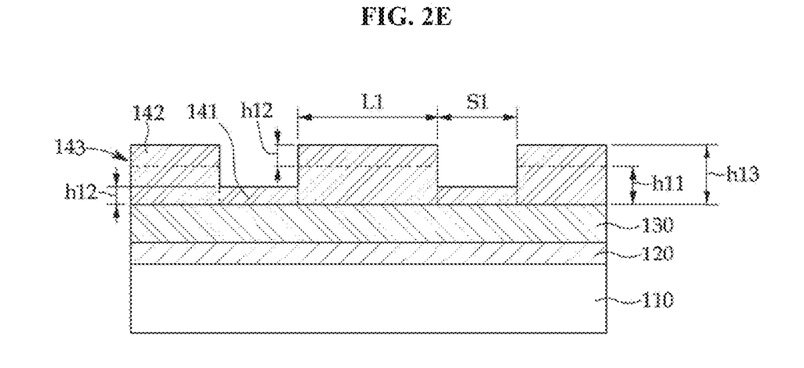

Referring to FIG. 2E, deposition is performed using a metal for the entire surface including the patterned metal layer 140 and the exposed portions of first photoresist layer 130, so as to form a metal pattern 143 having a pattern. The metal used for the deposition is the same material as the metal layer 140 of FIG. 2A. For example, the metal layer 140 of FIG. 2A is formed of aluminum (Al), and aluminum (Al) is also used in the deposition.

The metal pattern 143 has a structure in which a plurality of lines having predetermined linewidth L1 and thickness h13 are spaced apart from each other by a predetermined space S1. Further, a thin film portion 141 is formed in the space between lines 142 adjacent to each other. A thickness of the line 142 is marked with h13. That is, the line 142 has a thickness h13 of about 70 nm to about 200 nm.

The thin film portion 141 is formed to be thin enough to transmit light. The thin film portion 141 has a thickness h12 of about 20 nm to about 50 nm. Consequently, the thickness h13 of the line 142 may be equal to the sum of a thickness h11 of the metal layer 140 and a thickness h12 of a deposition layer (i.e. h13=h11+h12).

Light applied for exposure of first photoresist layer 130 is transmitted through the thin film portion 141 of metal pattern 143 to set up a surface plasmon resonance pattern at the interface between the metal layer 140 and the first photoresist layer 130.

The line 142 has a width L1 of about 150 nm to about 600 nm, and the space S1 between the lines 142 is about 100 nm to about 300 nm. That is, the thin film portion 141 has a width S1 of about 100 nm to about 300 nm. The exposure light has a longer wavelength than the width S1 of the thin film portion. In the present invention, the exposure light may be an i-ray ($\lambda$=365 nm).

Figure 2F:
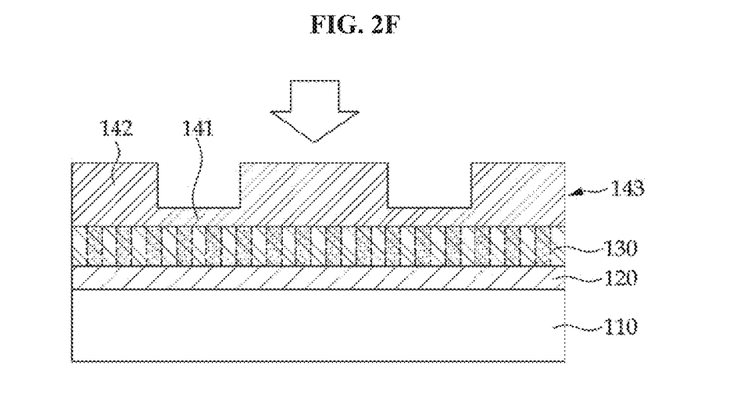

Light is irradiated onto the metal pattern 143 so that the surface plasmon resonance pattern is set up on a surface of the metal pattern 143 to produce a fine exposure pattern in first photoresist layer 130 (see FIG. 2F). The exposure pattern produced in the first photoresist layer 130 has a linewidth much smaller than the linewidths of the metal pattern 143.

Conditions under which the surface plasmon is excited have been studied in a variety of fields. For instance, it is known that when a metal thin film in which small slits are repeatedly formed is irradiated with light having a larger wavelength than a space between the slits of the metal thin film, the light polarized in a traverse direction of the slits allows a surface plasmon resonance to occur. According to an embodiment of the present invention, an effect of such surface plasmons is used to expose the first photoresist layer 130 to light and produce an ultrafine pattern.

In other words, when light having a larger wavelength than the space S1 between the lines 142 is incident on the metal pattern 143, the surface plasmon is excited on the surface of the metal pattern 143, and the excited surface plasmon transmits light energy to the first photoresist layer 130 along the surface of the metal pattern 143 in a surface plasmon wave form.

Herein, the light to excite the metal pattern 143 is polarized in a direction of repeatedly arranging the plurality of lines, namely in a direction perpendicular to a longitudinal direction of the lines in metal pattern 143. For the excitation, polarized light is, however, not necessarily irradiated. That is, although light having a plurality of polarization components is irradiated, only light polarized in a direction perpendicular to the longitudinal direction of line patterns may contribute to the excitation of surface plasmons.

In the exposure process of FIG. 2F, light, e.g., i-ray having a wavelength of 365 nm, is irradiated to expose the first photoresist layer 130. The shaded portion represents the exposed portion of the first photoresist layer 130 in FIG. 2F.

Figure 2G:
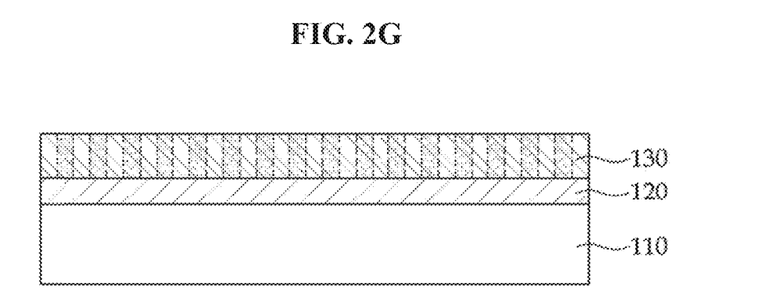

Referring to FIG. 2G, an exposure pattern is formed in the first photoresist layer 130 by the surface plasmons. The exposure pattern is determined by a distribution pattern of the light energy transmitted to the first photoresist layer 130. The distribution of the light energy varies depending on the kinds of a metal, the linewidth L1, space S1, and thickness h13 of the line formed on the metal layer 140, the thickness h12 of the thin film portion, and the wavelength of irradiated light.

Figure 2H:
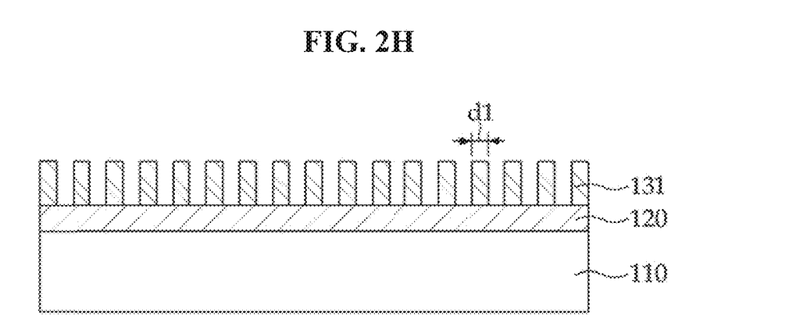
Figure 2I:
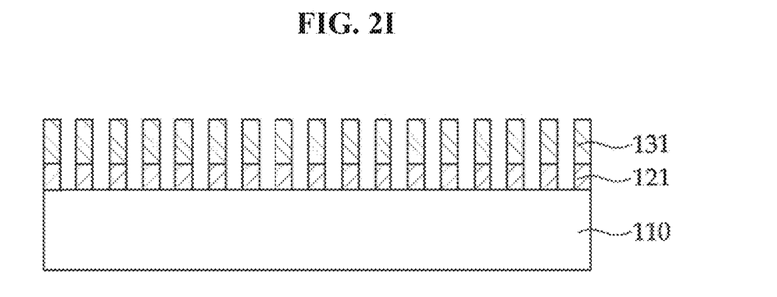

After this exposure of first photoresist pattern 130 by the surface plasmons, the metal pattern 143 is then removed and the first photoresist layer 130 is then developed so that the first photoresist pattern 131 is formed (see FIG. 2H).

The first photoresist patterns 131 have a predetermined linewidth d1 and are separated from each other at a predetermined space. Herein, the linewidth d1 and the space between lines of the first photoresist patterns 131 are about ½ to about ¹⁄₁₀ of the linewidth L1 and the space S1 between the lines 142 of the metal pattern 143. Further, the linewidth d1 of the first photoresist patterns 131 may be variously controlled to be about ½ to about ¹⁄₁₀ of the irradiated light wavelength (i-ray) by adjusting the shape of the metal pattern 143.

Figure 2J:
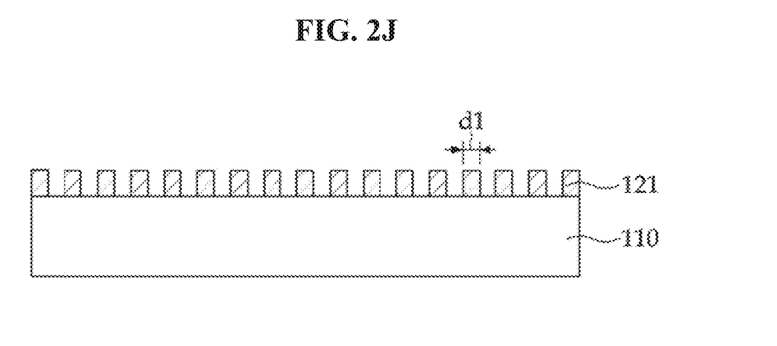

The etching target material layer 120 is etched using the first photoresist patterns 131 as a mask, and then the residual first photoresist patterns 131 is removed so that an element pattern 121 is formed (see FIG. 2J).

In detail, the element patterns 121 have a predetermined linewidth d1 and a predetermined space therebetween. The element pattern 121 has a linewidth d1 of about 30 nm to about 100 nm. The element pattern 121 has a narrower linewidth and a higher pattern density than that of the metal pattern 143.

Such an element pattern 121 may be used for a line of a semiconductor device. In the case where the element pattern 121 has a linewidth of, for example, about 70 nm or less, it may be employed as a wire grid polarizer pattern of a display substrate.

Hereinafter, a pattern forming method according to a second embodiment of the present invention will be described in detail with reference to FIGS. 3A to 3I.

Figure 3A:
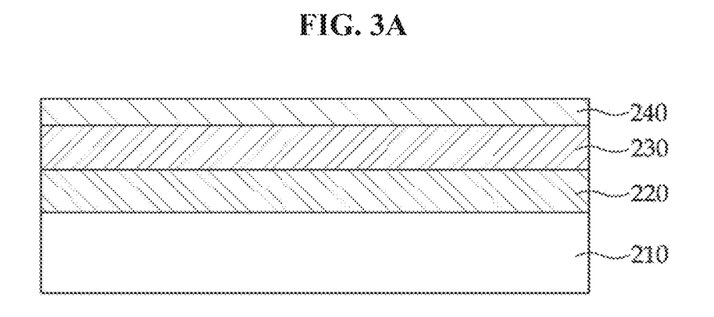
FIGS. 3A to 3I are cross-sectional views showing a process of forming a pattern according to a second embodiment of the present invention.

Referring now to FIG. 3A, a first photoresist layer 220, a metal layer 230, and a second photoresist layer 240 are formed on a substrate 210. An antireflective layer such as bottom antireflective coating (BARC) may be further formed between the substrate 210 and the first photoresist layer 220.

The substrate, the first photoresist layer, the metal layer, and the second photoresist layer have been previously described, and thus further description thereof will not be provided below.

Figure 3B:
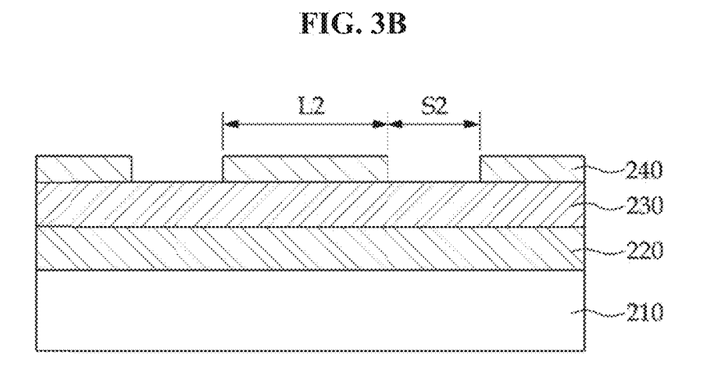

A pattern mask is formed on an upper portion of the second photoresist layer 240, light exposure is performed, and then the second photoresist layer 240 is developed to produce a second pattern shape as shown in FIG. 3B. The second patterns have a predetermined linewidth L2 and are separated from each other at a predetermined space S2.

Figure 3C:
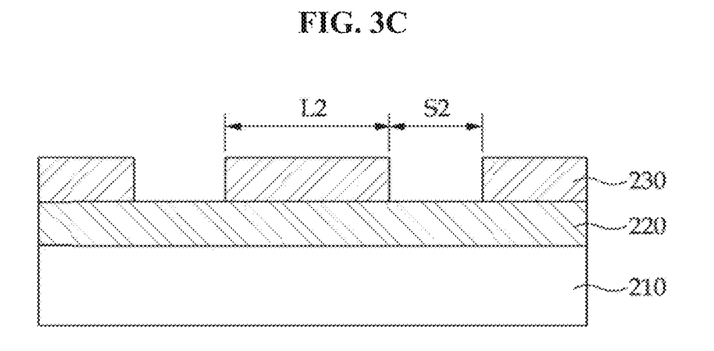

The metal layer 230 is etched using the second photoresist layer 240 patterned into the second pattern shape as a mask to produce the second pattern in metal layer 230 as shown in FIG. 3C.

Figure 3D:
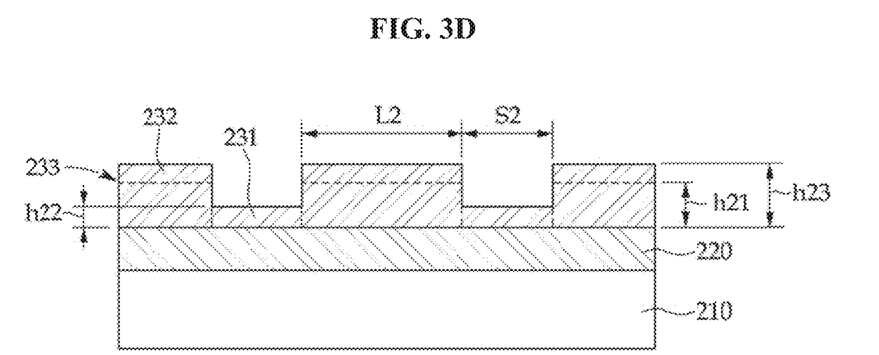

Referring to FIG. 3D, deposition is performed using a same metal as that of metal layer 230. The deposition blankets an entire surface of the patterned metal layer 230 and exposed portions of the first photoresist layer 220 to produce a metal pattern 233 having a second pattern.

The metal pattern 233 has a structure in which a plurality of lines having a predetermined linewidth L2 and thickness h23 are arranged in parallel to each other and spaced apart from each other by the predetermined space S2. Further, a thin film portion 231 is formed between the adjacent lines 232.

The line 232 has a thickness h23 of about 70 nm to about 200 nm. Meanwhile, the thin film portion 231 is formed to be thin enough for light to transmit therethrough, and has a thickness h22 of about 20 nm to about 50 nm.

The line 232 has a width L2 of about 150 nm to about 600 nm, and the space S2 between the adjacent lines is about 100 nm to about 300 nm. That is, the thin film portion 231 has a width S2 of about 100 nm to about 300 nm. The thin film portion 231 has a smaller width S2 than a wavelength of the light applied to the exposure.

Figure 3E:
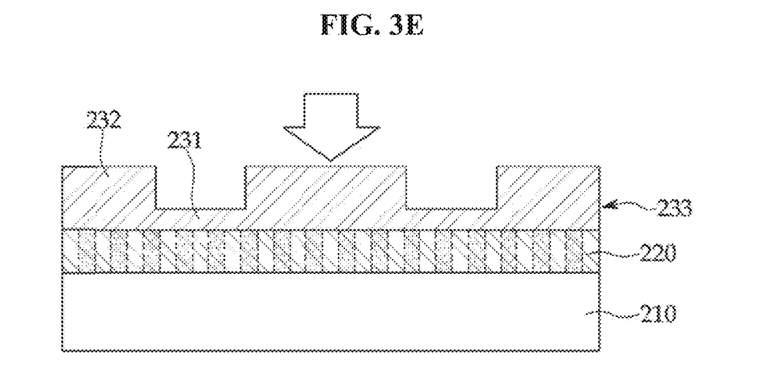
Figure 3F:
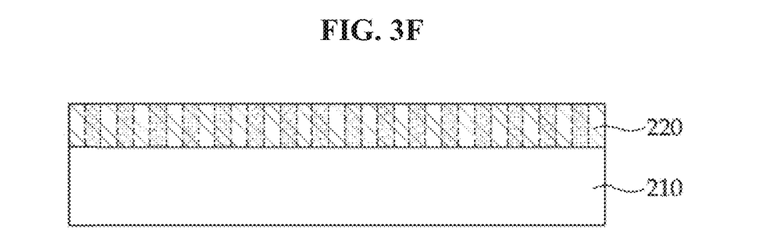

Light is irradiated onto the metal pattern 233 so that a surface plasmon resonance pattern occurs on a surface of the metal pattern 233 to expose the first photoresist layer 220 (see FIG. 3E) according to a fine pattern (i.e. first photoresist pattern). In the exposure of FIG. 3E, light, e.g., i-ray having a wavelength of 365 nm, is irradiated to expose the first photoresist layer 220. The shaded portion represents the exposed portion of the first photoresist layer 220 in FIG. 3E.

Figure 3G:
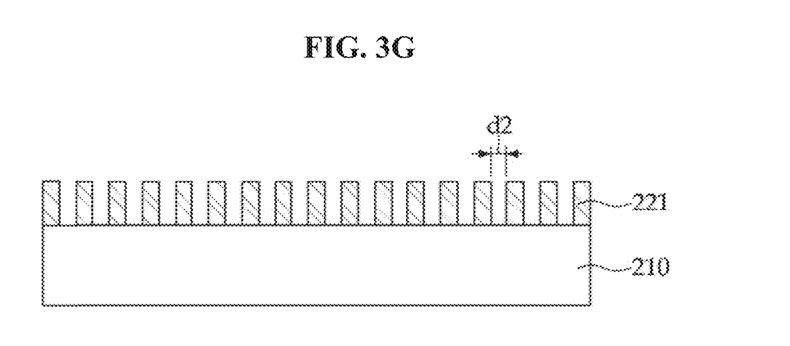

The metal pattern 233 is then removed (see FIG. 3F) and the first photoresist layer 220 is then developed so that a first photoresist pattern 221 is formed (see FIG. 3G).

The first photoresist patterns 221 have a predetermined linewidth and are separated from each other by a predetermined space d2. Herein, the space d2 between lines of the first photoresist pattern 221 may vary depending on shapes and dimensions of the metal pattern 233, and may be variously controlled to be about ½ to about ¹⁄₁₀ of the irradiated light wavelength (i-ray). The space d2 between the lines of the first photoresist pattern 221 may be about 30 nm to about 100 nm.

Figure 3H:
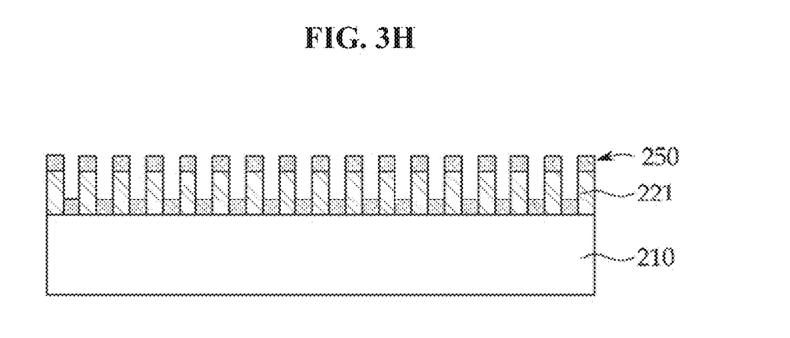

In the second embodiment of the present invention, a pattern-forming material is then deposited over the entire surface of the first photoresist pattern 221 and exposed portions of the substrate 210 to form a pattern-forming material layer 250 (see FIG. 3H). The pattern-forming material layer 250 is formed on an upper portion of the first photoresist pattern 221 and between the first photoresist patterns 221 on the substrate 210.

The pattern-forming material layer 250 may be formed by depositing line-forming materials. That is, the pattern-forming material layer 250 may include at least one of a metal and a transparent conducting oxide (TCO). The metal may include at least one selected from a group consisting of copper (Cu), magnesium (Mg), silver (Ag), gold (Au), calcium (Ca), lithium (Li), chromium (Cr), and aluminum (Al). Examples of the transparent conducting oxide (TCO) may include at least one selected from a group consisting of indium tin oxide (ITO), indium zinc oxide (IZO), zinc oxide (ZnO), and indium oxide ($In_2O_3$).

The pattern-forming material layer 250 may be a single layer or a multilayer structure. For instance, the pattern-forming material layer 250 may have a structure in which the metal and the transparent conducting oxide (TCO) are alternately laminated.

Next, the first photoresist pattern 221 is removed (see FIG. 3I) in a liftoff process by dissolving the first photoresist pattern in a solvent. When the first photoresist pattern 221 is removed, the pattern-forming material layer 250 on the first photoresist pattern 221 is removed together (i.e. liftoff). As a result, the pattern-forming material layer on the substrate 210 remains and becomes element pattern 251.

Figure 3I:
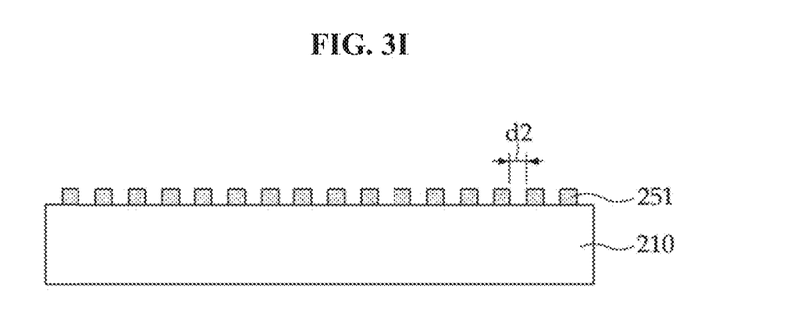

The element pattern 251 on the substrate 210 may be used for a line of a semiconductor device. In the case where the element pattern 251 on the substrate 210 has a linewidth of 70 nm or less for example, it may be used as a wire grid polarizer pattern of a display substrate.

Hereinafter, a third embodiment of the present invention wherein a metal pattern 341 is produced by a die 370 according to the stamping technique to be described with reference to FIGS. 4A and 4B.

Figure 4A:
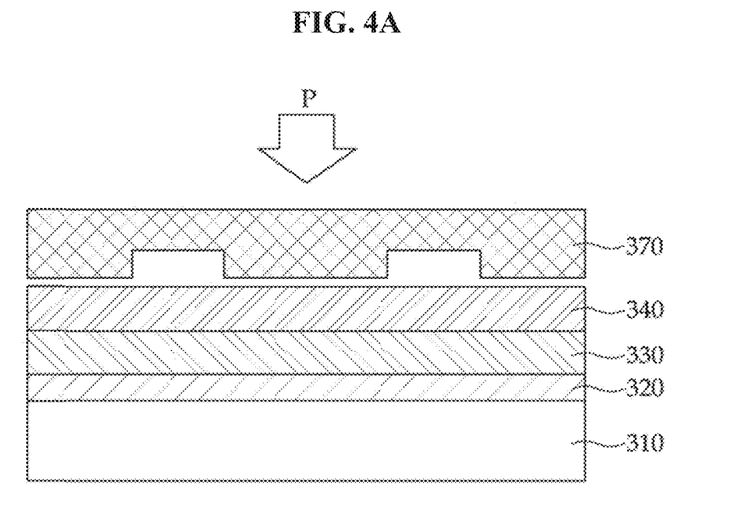
FIGS. 4A and 4B are cross-sectional views showing a process of forming a pattern on a metal layer by using an stamping process using a die according to a third embodiment of the present invention.

Referring to FIG. 4A, an etching target material layer 320, a first photoresist layer 330, and a metal layer 340 are first formed on a substrate 310. The metal layer 340 is made out of a metal having high ductility and malleability. Therefore, a shape of the metal layer 340 can be easily altered by pressure.

An imprint master (or die) 370 having a predetermined pattern is prepared. The master (or die) 370 is formed of a material such as silicon (Si), quartz, or nickel (Ni), and is engraved with a pattern shape which is intended to be formed on the metal layer 340. The intended metal pattern may have a shape in which a plurality of lines are repeatedly formed in accordance with a predetermined cycle, for example.

Figure 4B:
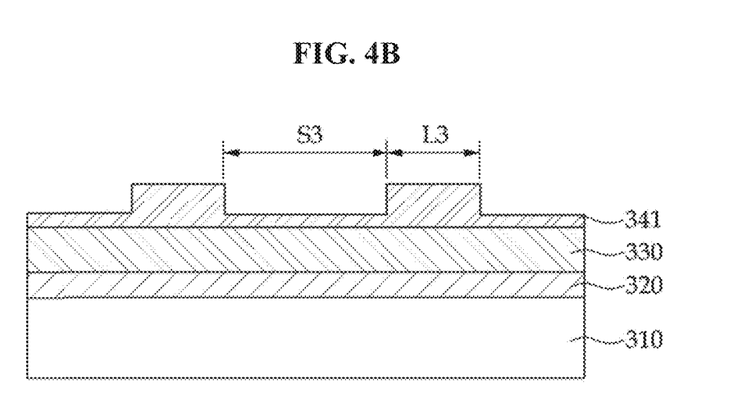

Via a machine press or a stamping press, a predetermined pressure P is applied to the metal layer 340 using the die 370, so that a metal layer 341 is formed to have the relief pattern of the die 370 in which a plurality of lines having a predetermined width L3 are spaced apart from each other by a predetermined space S3 as shown in FIG. 4B.

Next, an element pattern is formed in the etching target material layer 320 through the above-described processes of FIGS. 2F to 2J. Alternatively, the element pattern may instead be produced in etching target material layer through the above-described processes of FIGS. 3E to 3I.

Figure 5:
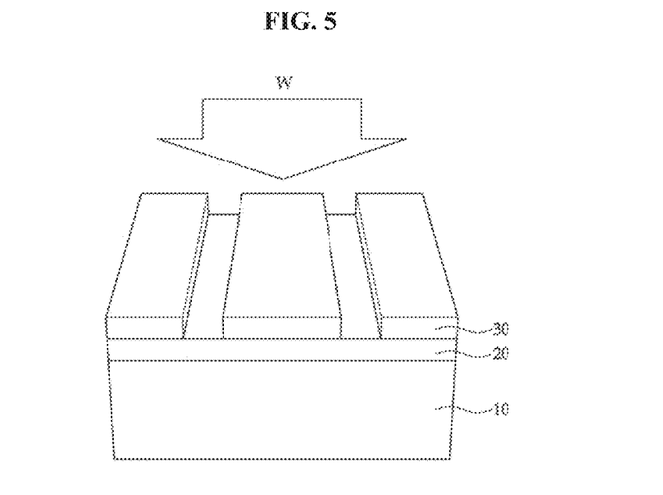
FIG. 5 is a perspective view showing an structure, including a metal pattern to produce an exposure test pattern.

Hereinafter, patterning by using a metal layer without a thin film portion will be described in detail with reference to FIGS. 5, 6A, and 6B. FIG. 5 is a perspective view showing a pattern forming model provided with a metal pattern having only a metal line without a thin film portion. The model of FIG. 5 includes a substrate 10, a photoresist layer 20 on the substrate 10, and a metal line 30 on the photoresist layer 20.

Figure 6A:
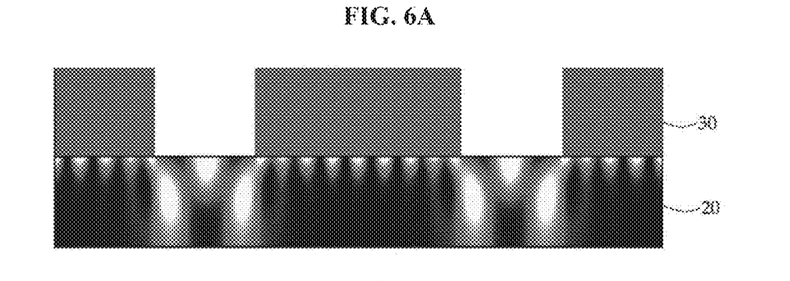
FIGS. 6A and 6B are cross-sectional views showing results of exposure tests conducted by means of surface plasmons.
Figure 6B:
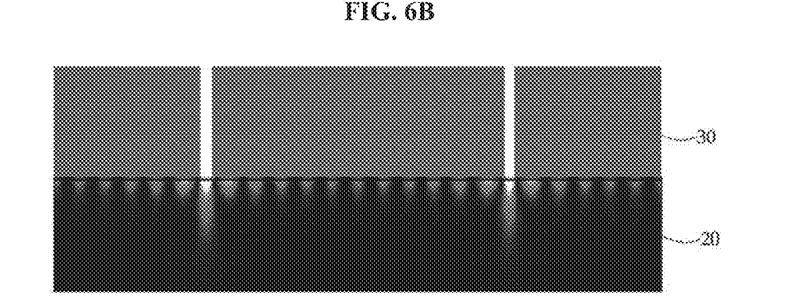

FIGS. 6A and 6B show results of exposure performed by surface plasmons using the model of FIG. 5. The comparatively bright (less dark) portion represents a portion where the exposure is performed in FIGS. 6A and 6B.

In FIG. 6A, the metal line 30 has a width of about 445 nm, and the space between the metal lines 30 is about 225 nm. As shown in FIG. 6A, if the space is large, exposure of the photoresist layer 20 increases, and thus the photoresist layer 20 may be sufficiently exposed. However, since the surface plasmon propagates along an interface between a metal and a dielectric (the photoresist layer 20) and transfers energy to the dielectric, it is difficult to transfer surface plasmon energy in a uniform way in a space where the metal line is not formed. Therefore, if the space is large as shown in FIG. 6A, the photoresist layer 20 is not uniformly exposed, because portions of the photoresist layer 20 corresponding to the space are exposed much brighter and with a different spacing than portions of the photoresist layer 20 corresponding to the metal lines. When the exposure is not uniformly performed, it is difficult to obtain a uniform pattern.

FIG. 6B shows a space between the metal lines 30 formed to be very small for uniform exposure. In FIG. 6B, the metal line 30 has a width of about 645 nm, and the space between the metal lines 30 has a width of about 25 nm.

As shown in FIG. 6B, if the space between the metal lines is small, the surface plasmon energy can be uniformly transferred along the interface between the metal line 30 and the photoresist layer 20. However, if the space is small, exposure of the photoresist layer 20 decreases, and thus the photoresist layer 20 may not be sufficiently exposed. Consequently, as shown in FIG. 6B, since the surface plasmon energy is not sufficiently transferred to the interior of the photoresist layer 20, a pattern is not properly formed in photoresist layer 20.

In contrast, according to the embodiments of the present invention, the space between the metal lines is large enough to transfer the sufficient surface plasmon energy to the interior of the photoresist layer 20 so that the photoresist layer 20 can be sufficiently exposed. Further, a metal thin film portion is formed between the relatively thicker metal lines in order to transfer the surface plasmon energy in a uniform way so that the exposure is uniformly performed. Consequently, the inventors have unexpectedly found that a uniform and sufficient exposure pattern can be formed by surface plasmon resonance between a metal pattern and a photoresist layer when 1) the gap between the relatively thicker portions in the metal pattern is large and 2) the gap between the relatively thicker portions in the metal pattern is occupied by a thin film of metal.

Figure 7:
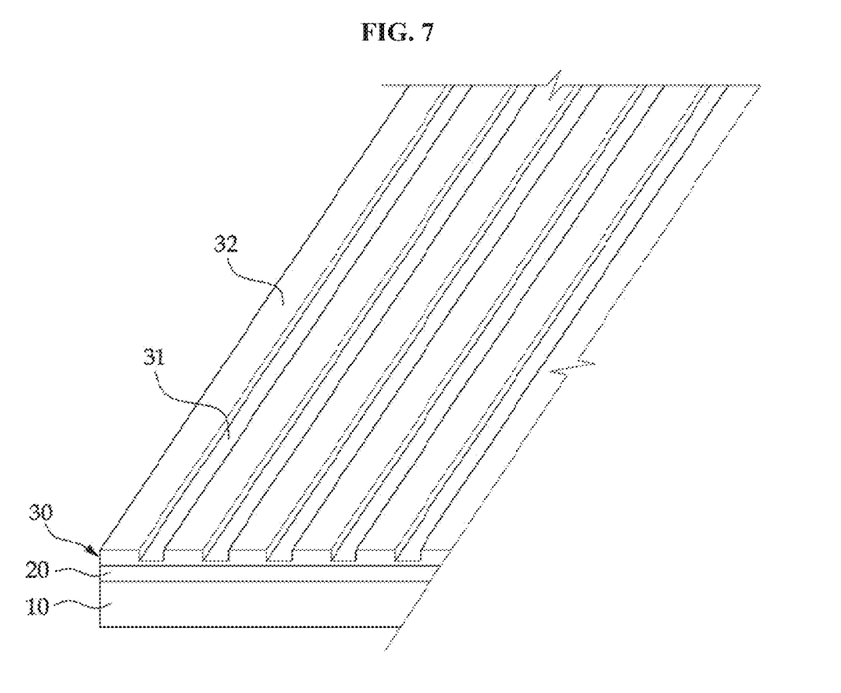
FIG. 7 is a perspective view showing an improved structure for producing an improved surface plasmon resonance pattern and an improved fine exposure pattern in the photoresist layer according to the principles of the present invention.

More specifically, the Inventors of the present invention have recognized that the metal pattern 30 of FIG. 5 is insufficient to provide a uniform fine exposure pattern in photoresist layer 20. Such a structure of FIG. 5 would provide excessive amounts of exposure to portions of photoresist layer 20 that are not covered by metal line 30, and inadequate exposure to portions of photoresist layer 20 underneath the metal lines. The Inventors have overcome this problem by providing the metal pattern 30 according to the arrangement of FIG. 7, whereby metal pattern 30 has thick portions 32 and thin portions 31 occupying the spaces between adjoining thick portions 32. By including a thin portions 31 that occupy spaces between adjoining thick portions 32 in the metal pattern 30 of FIG. 7, the resultant surface plasmon resonance pattern that is set up transfers energy in a uniform manner along the interface between the metal pattern 30 and photoresist layer 20, so that an improved exposure pattern can be formed in photoresist layer 20, the improved exposure pattern having a uniform fine pattern with narrow line widths, adequate amount of exposure, and without having overexposure of portions of the photoresist layer 20 that do not correspond to thick portions 32 of the metal pattern 30 and without having underexposure elsewhere.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims, and equivalents thereof.

What is claimed is:

1. A method of foming a pattern, comprising:
    forming an etching target material layer on a substrate;
    forming a first photoresist layer on the etching target material layer;
    forming a metal pattern on the first photoresist layer, the metal pattern in which a plurality of lines having predetermined linewidth and thickness are spaced apart from each other at a predetermined distance, wherein the metal pattern comprises a thin film portion between the lines adjacent to each other;
exciting surface plasmons in the metal pattern by light irradiation to expose the first photoresist layer to form a first pattern shape;
forming a first photoresist pattern by removing the metal pattern and developing the first photoresist layer; and
etching the etching target material layer by using the first photoresist pattern as a mask.

2. The method of claim 1, wherein the thin film portion has a thickness of about 20 nm to about 50 nm.

3. The method of claim 1, wherein the space between the adjacent lines is about 100 nm to about 300 nm.

4. The method of claim 1, wherein the light irradiation comprises irradiating light with larger wavelength than the space between the adjacent lines.

5. The method of claim 1, wherein the light irradiation comprises irradiating i-ray.

6. The method of claim 1, wherein the first photoresist pattern has higher pattern density than the metal pattern.

7. The method of claim 1, wherein the forming of the metal pattern comprises:
forming a metal layer on the first photoresist layer;
forming a second photoresist layer on the metal layer;
patterning the second photoresist layer into a second pattern;
etching the metal layer by using the patterned second photoresist layer as a mask and removing the second photoresist layer; and
forming a deposition layer on the etched metal layer and the exposed first photoresist layer by performing metal deposition.

8. The method of claim 1, wherein the forming of the metal pattern comprises:
forming a metal layer on the first photoresist layer; and
stamping the metal layer with a die engraved to have a pattern shape.

9. The method of claim 1, wherein the metal layer is formed of any one selected from a group consisting of gold (Au), aluminum (Al), silver (Ag), chromium (Cr), nickel (Ni), titanium (Ti), tantalum (Ta), and tungsten (W).

10. The method of claim 1, wherein the etching target material layer comprises at least one of a metal and a transparent conductive oxide (TCO).

11. A method of foming a pattern, comprising:
forming a first photoresist layer on a substrate;
forming a metal pattern on the first photoresist layer, the metal pattern in which a plurality of lines having predetermined linewidth and thickness are spaced apart from each other at a predetermined distance, wherein the metal pattern comprises a thin film portion between the lines adjacent to each other;
exciting surface plasmons in the metal pattern by light irradiation to expose the first photoresist layer to have a first pattern shape;
forming a first photoresist pattern by removing the metal pattern and developing the first photoresist layer;
depositing a pattern-forming material on the first photoresist pattern and the substrate; and
removing the first photoresist pattern.

12. The method of claim 11, wherein the thin film portion has a thickness of about 20 nm to about 50 nm.

13. The method of claim 11, wherein the space between the adjacent lines is about 100 nm to about 300 nm.

14. The method of claim 11, wherein the light irradiation comprises irradiating light with larger wavelength than the space between the adjacent lines.

15. The method of claim 11, wherein the forming of the metal pattern comprises:
forming a metal layer on the first photoresist layer;
forming a second photoresist layer on the metal layer;
patterning the second photoresist layer into a second pattern;
etching the metal layer by using the patterned second photoresist layer as a mask and removing the second photoresist layer; and
forming a deposition layer on the etched metal layer and the exposed first photoresist layer by performing metal deposition.

16. The method of claim 11, wherein the forming of the metal pattern comprises:
forming a metal layer on the first photoresist layer; and
pressing the metal layer by using a master engraved with a pattern shape.

17. The method of claim 11, wherein the pattern-forming material comprises at least one of a metal and a transparent conductive oxide (TCO).

18. The method of claim 17, wherein the pattern forming material has a linewidth in the range of 30 to 100 nm and is less than each of the predetermined linewidth and the predetermined distance of the metal pattern and the wavelength of light used to irradiate the metal pattern.

19. A method of foming a pattern in an etching target material layer, comprising:
providing a substrate;
forming the etching target material layer on the substrate;
forming a first photoresist layer on the etching target material layer;
forming a metal pattern on the first photoresist layer, the metal pattern including a plurality of first line portions and a plurality of second line portions alternately arranged, each first line portion having a first thickness and having a first linewidth, and each second line portion having a second thickness that is smaller than the first thickness, having a second linewidth and occupying a space between adjacent first line portions;
exposing a first pattern shape in the first photoresist layer by exciting surface plasmons in the metal pattern by exposure to light irradiation;
forming a first photoresist pattern corresponding to the first pattern shape in the first photoresist layer by removing the metal pattern and developing the first photoresist layer; and
forming the pattern in the etching target material layer by etching the etching target material layer by using the first photoresist pattern as an etch mask.

20. The method of claim 19, wherein the first thickness is in the range of about 70 to 200 nm, and the second thickness is in the range of about 20 to 50 nm.

* * * * *